US005614900A

United States Patent [19]

Watanabe

[11] Patent Number: 5,614,900

[45] Date of Patent: Mar. 25, 1997

[54] VARIABLE WORD LENGTH CODE DECODING APPARATUS HAVING PLURAL DECODING TABLES FOR DECODING LONG WORDS

[75] Inventor: Mitsuhiro Watanabe, Tokyo, Japan

[73] Assignee: NEC Corporation, Tokyo, Japan

[21] Appl. No.: 315,724

[22] Filed: Sep. 30, 1994

[30] Foreign Application Priority Data

Sep. 30, 1993 [JP] Japan .................................. 5-245031

[51] Int. Cl.⁶ ........................................................ H03M 7/40
[52] U.S. Cl. ................................................ 341/67; 341/106
[58] Field of Search ................................. 341/65, 67, 106

[56] References Cited

U.S. PATENT DOCUMENTS

| | | | |
|---|---|---|---|
| 4,509,038 | 4/1985 | Hirano | 341/67 |
| 4,593,267 | 6/1986 | Kuroda et al. | 341/67 |
| 4,819,079 | 4/1989 | Takao | 358/260 |
| 5,055,841 | 10/1991 | Cordell | 341/67 |
| 5,227,789 | 7/1993 | Barry et al. | 341/65 |
| 5,229,863 | 7/1993 | Kao et al. | 358/426 |
| 5,404,138 | 4/1995 | Kim et al. | 341/67 |
| 5,471,594 | 11/1995 | Stone | 395/375 |

Primary Examiner—Marc S. Hoff
Attorney, Agent, or Firm—Young & Thompson

[57] ABSTRACT

At least two code tables are used to decode a variable word length code sequence. A first code table stores code information of variable word length codes having code lengths shorter than or equal to 8 bits. In addresses of the first code table corresponding to longer variable word length code than 8 bits, data is stored indicative of longer codes than 8 bits. At first, the first code table is accessed. If the data being read from the first code table indicates a code length not more than 8 bits, an input variable word length code is identified and decoded. If the data being read from the first code table indicates a code length longer than 8 bits, the second code table is accessed and the input variable word length code is identified and decoded.

12 Claims, 7 Drawing Sheets

FIG. 1

| VARIABLE WORD LENGTH CODE | | | CODE LENGTH | LEVEL |
|---|---|---|---|---|
| 00 | | | 2 | 1 |
| 01 | | | 2 | 2 |
| 100 | | | 3 | 3 |
| 1010 | | | 4 | 4 |
| 1011 | | | 4 | 5 |
| 1100 | | | 4 | 6 |
| 1101 | 0 | | 5 | 7 |
| 1101 | 1 | | 5 | 8 |
| 1110 | 0 | | 5 | 9 |
| 1110 | 10 | | 6 | 10 |
| 1110 | 11 | | 6 | 11 |
| 1111 | 000 | | 7 | 12 |
| 1111 | 001 | | 7 | 13 |
| 1111 | 110 | | 7 | 14 |
| 1111 | 011 | | 7 | 15 |
| 1111 | 1000 | | 8 | 16 |
| 1111 | 1001 | | 8 | 17 |
| 1111 | 1010 | | 8 | 18 |

FIG. 2A

| VARIABLE WORD LENGTH CODE | | | CODE LENGTH | LEVEL |
|---|---|---|---|---|
| 1111 | 1011 | 0 | 9 | 19 |
| 1111 | 1011 | 1 | 9 | 20 |
| 1111 | 1100 | 0 | 9 | 21 |
| 1111 | 1100 | 1 | 9 | 22 |
| 1111 | 1101 | 0 | 9 | 23 |
| 1111 | 1101 | 10 | 10 | 24 |
| 1111 | 1101 | 11 | 10 | 25 |
| 1111 | 1110 | 00 | 10 | 26 |
| 1111 | 1110 | 01 | 10 | 27 |
| 1111 | 1110 | 10 | 10 | 28 |
| 1111 | 1110 | 110 | 11 | 29 |
| 1111 | 1110 | 111 | 11 | 30 |
| 1111 | 1111 | 000 | 11 | 31 |
| 1111 | 1111 | 001 | 11 | 32 |
| 1111 | 1111 | 0100 | 12 | 33 |
| 1111 | 1111 | 0101 | 12 | 34 |
| 1111 | 1111 | 0110 | 12 | 35 |
| 1111 | 1111 | 0111 | 12 | 36 |

FIG. 2B

| VARIABLE WORD LENGTH CODE | CODE LENGTH | LEVEL |
|---|---|---|
| 1111 1111 1000 000 | 15 | 37 |
| 1111 1111 1000 0010 | 16 | 38 |
| 1111 1111 1000 0011 | 16 | 39 |
| 1111 1111 1000 0100 | 16 | 40 |
| 1111 1111 1000 0101 | 16 | 41 |
| 1111 1111 1000 0110 | 16 | 42 |
| 1111 1111 1000 0111 | 16 | 43 |
| 1111 1111 1000 1000 | 16 | 44 |
| 1111 1111 1000 1001 | 16 | 45 |
| 1111 1111 1000 1010 | 16 | 46 |
| 1111 1111 1000 1011 | 16 | 47 |
| 1111 1111 1000 1100 | 16 | 48 |
| 1111 1111 1000 1101 | 16 | 49 |
| 1111 1111 1000 1110 | 16 | 50 |
| 1111 1111 1000 1111 | 16 | 51 |
| 1111 1111 1001 0000 | 16 | 52 |
| 1111 1111 1001 0001 | 16 | 53 |
| 1111 1111 1001 0010 | 16 | 54 |

FIG. 2C

| ADDRESS | CODE LENGTH | DECODED VALUE |
|---|---|---|
| 00XXXXXX | 2 | 1 |
| 01XXXXXX | 2 | 2 |
| 100XXXXX | 3 | 3 |
| 1010XXXX | 4 | 4 |
| 1011XXXX | 4 | 5 |
| 1100XXXX | 4 | 6 |
| 11010XXX | 5 | 7 |
| 11011XXX | 5 | 8 |
| 11100XXX | 5 | 9 |
| 111010XX | 6 | 10 |
| 111011XX | 6 | 11 |
| 1111000X | 7 | 12 |
| 1111001X | 7 | 13 |
| 1111010X | 7 | 14 |
| 1111011X | 7 | 15 |
| 11111000 | 8 | 16 |
| 11111001 | 8 | 17 |
| 11111010 | 8 | 18 |
| THE OTHERS | 9 | -- |

| ADDRESS | CODE LENGTH | DECODED VALUE |
|---|---|---|
| 10110XXX | 9 | 19 |
| 10111XXX | 9 | 20 |
| 11000XXX | 9 | 21 |
| 11001XXX | 9 | 22 |
| 11010XXX | 9 | 23 |
| 110110XX | 10 | 24 |
| 110111XX | 10 | 25 |
| 111000XX | 10 | 26 |
| 111001XX | 10 | 27 |
| 111010XX | 10 | 28 |
| 1110110X | 11 | 29 |
| 1110111X | 11 | 30 |
| 1111000X | 11 | 31 |
| 1111001X | 11 | 32 |
| 11110100 | 12 | 33 |
| 11110101 | 12 | 34 |
| 11110110 | 12 | 35 |
| 11110111 | 12 | 36 |
| 11111XXX | 16 | -- |
| 0XXXXXXX | -- | -- |

| ADDRESS | CODE LENGTH | DECODED VALUE |
|---|---|---|
| 1000000X | 15 | 37 |
| 10000010 | 16 | 38 |
| 10000011 | 16 | 39 |
| 10000100 | 16 | 40 |
| 10000101 | 16 | 41 |
| 10000110 | 16 | 42 |
| 10000111 | 16 | 43 |
| 10001000 | 16 | 44 |
| 10001001 | 16 | 45 |
| 10001010 | 16 | 46 |
| 10001011 | 16 | 47 |
| 10001100 | 16 | 48 |
| 10001101 | 16 | 49 |
| 10001110 | 16 | 50 |
| 10001111 | 16 | 51 |
| 10010000 | 16 | 52 |
| 10010001 | 16 | 53 |
| 10010010 | 16 | 54 |
| THE OTHERS | -- | -- |

VARIABLE WORD LENGTH CODE DECODING APPARATUS HAVING PLURAL DECODING TABLES FOR DECODING LONG WORDS

BACKGROUND OF THE INVENTION

The invention relates to a variable word length code decoding method and apparatus for decoding an input variable word length code sequence, and more particularly relates to a decoding method which decodes the input variable word length code sequence quickly by using relatively small capacity code tables.

As is well known in the art, an amount of data to be transmitted or to be stored can be reduced by using a variable word length coding technique. In this technique, a variable word length code set is determined based on a generation probability distribution of symbols to be outputted from an information source. More specifically, shorter length codes are assigned to symbols with higher generation probabilities while longer length codes are assigned to symbols with lower generation probabilities. Thus, the amount of data can be reduced.

Three conventional methods are known for decoding the input variable word length code sequence.

The first conventional method uses a single code table which stores a binary code tree representing a variable word length code set. In the method, a variable word length code which coincides with a part of the input variable word length code sequence is searched by tracing the binary code tree on a bit-by-bit basis.

The second conventional method uses another type of code table which stores bit patterns of variable word length codes and the corresponding decoded values. In that method, each variable word length code stored in the code table is compared with the input variable word length code sequence on a code-by-code basis.

The third conventional method uses still another type of code table having addresses that represent data associated with bit patterns of variable word length codes and which stores a decoded value and a code length in the corresponding address. In that table, the required number of address bits corresponds to the maximum code length in a variable word length code set. The third conventional method is described, for example, in U.S. Pat. No. 4,509,038.

However, the conventional methods have the following disadvantages. The first conventional method requires a long decoding time because the method performs bit-by-bit operations. The second conventional method also requires a long decoding time because each code in the table is compared code-by-code with the input sequence. The third method, on the other hand, requires a huge capacity memory though the method requires a short decoding time.

SUMMARY OF THE INVENTION

It is therefore a principal object of the invention to provide a variable word length code decoding method apparatus which decodes a variable word length code sequence quickly by using relatively small capacity tables.

According to the invention, there is provided a variable word length code decoding method for decoding an input variable word length code sequence, comprising the steps of:

(A) storing first N bits of an undecoded variable word length code sequence into a first register;

(B) generating a first value by shifting rightward a value of the first register by $N-n_1$ bits, wherein $n_1$ is less than N, and storing the first value into a second register;

(C) reading a first code table based on an address which is indicated by the second register, wherein addresses of the first code table either represent first data associated with variable word length codes which belong to a first group of a variable word length code set having code lengths less than or equal to $n_1$ or represent first remaining data;

the first code table stores a decoded value and a code length in each address corresponding to the first data; and the first code table stores data representing a code length longer than $n_1$ in each address corresponding to the first remaining data;

(D) proceeding to the next step (E) if a code length read in the step (C) is longer than $n_1$, otherwise proceeding to the following step (G);

(E) generating a second value by changing the first $m_1$ bits of the value of the first register to zero values, wherein $m_1$ is less than $n_1$, and by shifting rightwards the changed value by $(N-n_1-m_1)$ bits and storing the second value into the second register;

(F) reading a second code table based on an address indicated by the second register, wherein addresses of the second code table represent second data associated with variable word length codes which belong to a second group of the variable word length code set, the code lengths of which are longer than $n_1$ and the first $m_1$ bits of which are removed; and the second code table stores a decoded value and a code length in each address corresponding to said second data;

(G) outputting a decoded value read in the step (C) or the step (F) to an output memory and returning to said step (A).

The invention also provides a decoder for performing the above method.

DETAILED DESCRIPTION OF PREFERRED EMBODIMENTS

Figure 1:
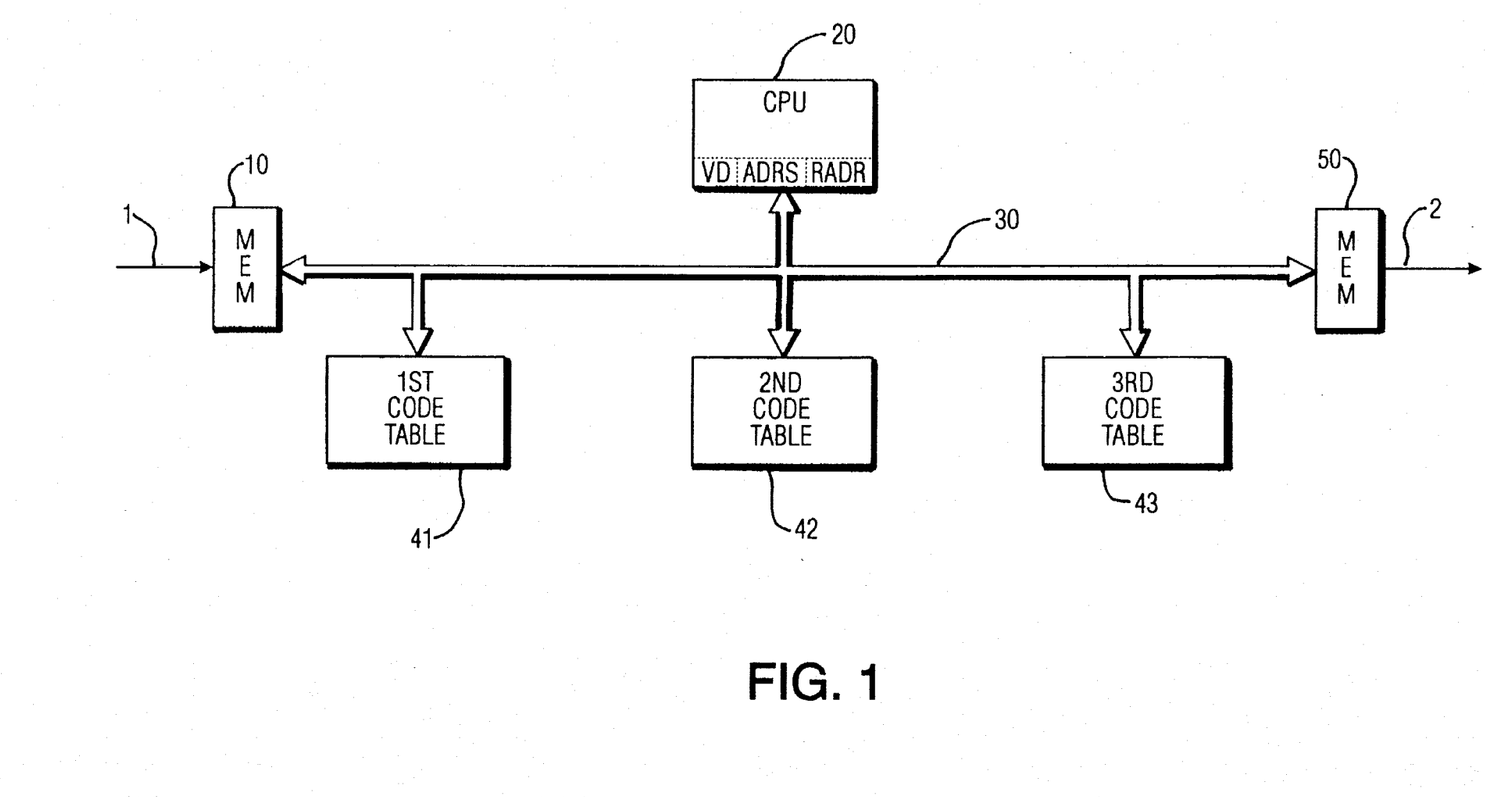
FIG. 1 shows a block diagram of an apparatus which performs the invention.

FIG. 1 shows a block diagram of an apparatus which performs the invention. The apparatus comprises an input memory 10 connected to a bus 30 for temporarily storing an input variable word length code sequence 1; a central processing unit (CPU) 20 being connected to the bus 30 and including three registers (VD, ADRS and RADR) for performing operations which will be described later; first to third code tables 41–43 connected to the bus 30 for storing first to third groups of variable word length code information, respectively; and an output memory 50 connected to the bus 30 for temporarily storing decoded values decoded by a combination of CPU 20 and first to third code tables 41–43 and outputting the decoded values to an external apparatus (not shown) via line 2.

Before further describing preferred embodiments of the invention, a variable word length code set used in these embodiments will first be described.

Figure 2A:
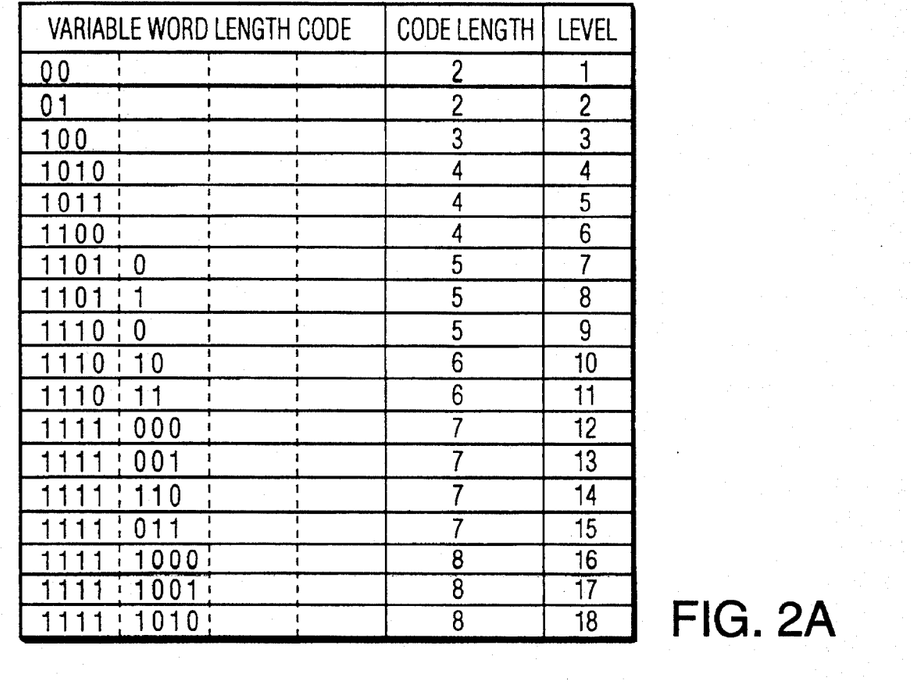
FIG. 2A shows a first group of a variable word length code set used in preferred embodiments.
Figure 2B:
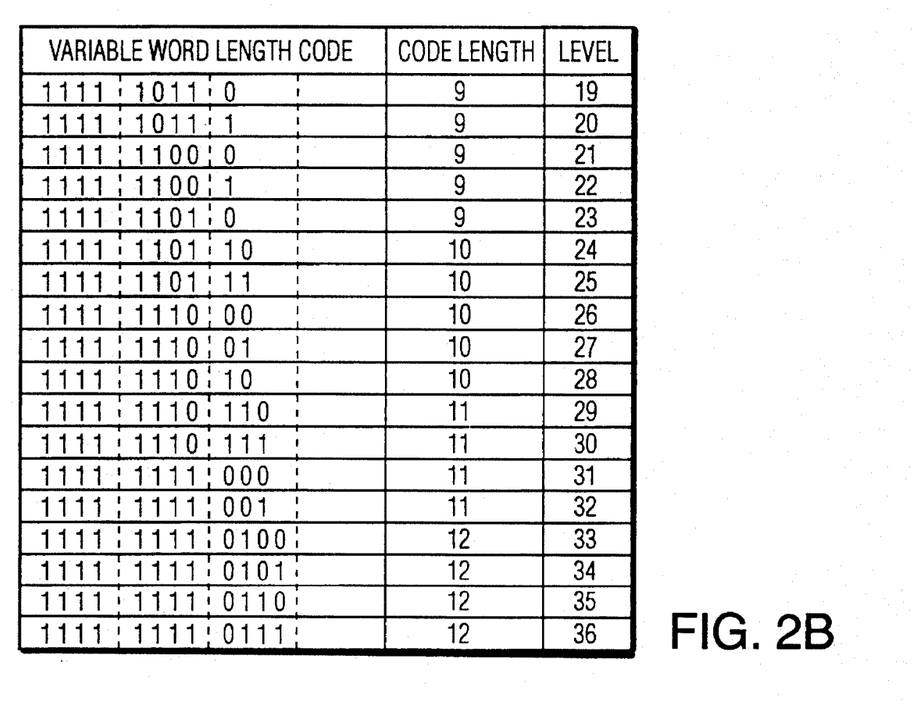
FIG. 2B shows a second group of the variable word length code set used in the preferred embodiments.
Figure 2C:
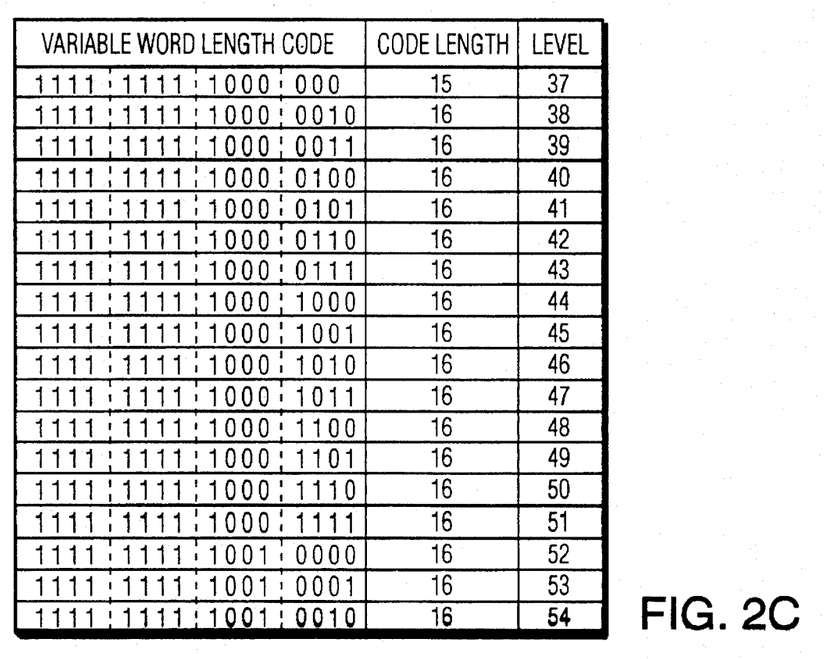
FIG. 2C shows a third group of the variable word length code set used in a second preferred embodiment.

FIGS. 2A and 2B show respectively an example of a first group and a second group of variable word length codes of a variable word length code set used in the first preferred embodiment of the invention while FIGS. 2A, 2B and 2C show respectively an example of a first to third group variable word length codes of a variable word length code set used in the second preferred embodiment of the invention.

As shown in FIGS. 2A and 2B, the first group of the variable word length code set consists of codes which have code lengths ($l_1$) not more than 8, (i.e., $n_1=8$) and the second group consists of codes which have code lengths ($l_2$) greater than $n_1$ and not more than 12 (i.e., $n_2=12$). In addition to the variable word length code set in the first embodiment, a variable word length code set in the second embodiment further includes the third group of codes which have code lengths ($l_3$) longer than $n_2(=12)$ and not longer than $N(=16)$ as shown in FIG. 2C.

In addition, it should be noted that first $m_1(=4)$ bits of the second group codes are common to each other (see FIG. 2B) and that first $m_2(=8)$ bits of the third group codes are common to each other (see FIG. 2C).

Figure 3A:
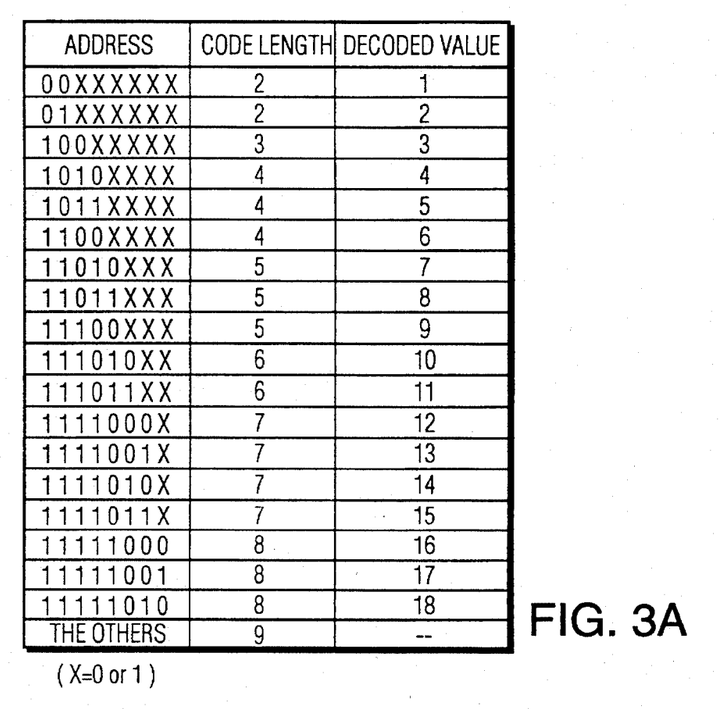
FIG. 3A shows contents of a first code table 41 in FIG. 1.
Figure 3B:
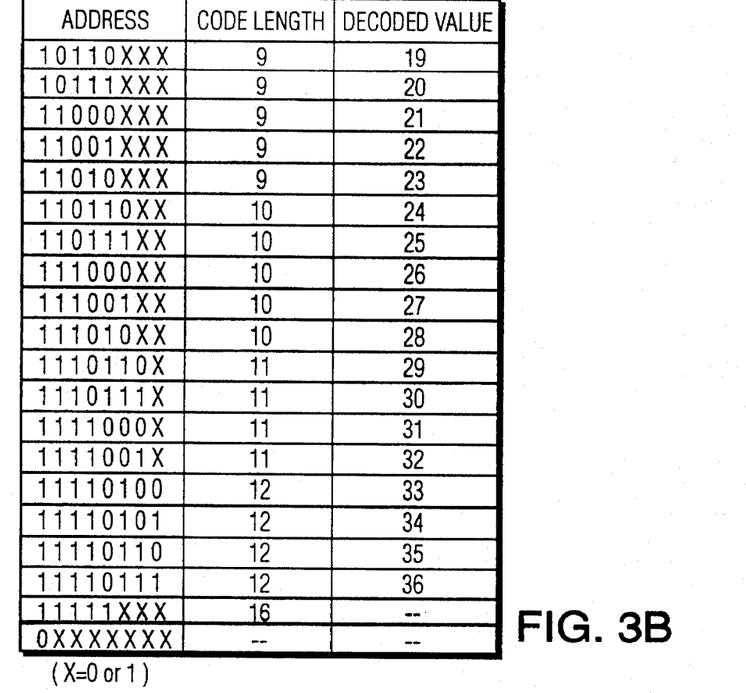
FIG. 3B shows contents of a second code table 42 in FIG. 1.
Figure 3C:
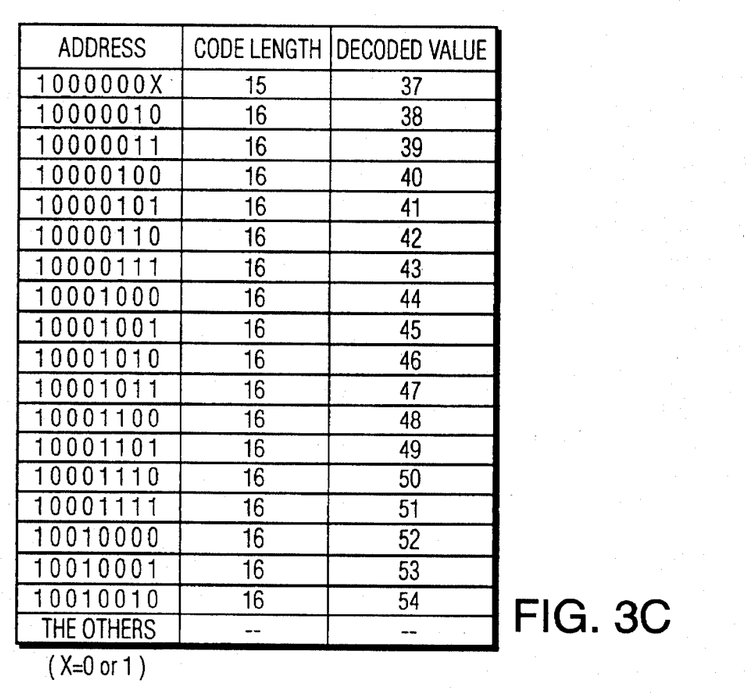
FIG. 3C shows contents of a third code table 43 in FIG. 1.

Since the present invention features internal embodiments of code tables, the internal embodiments of the code tables are explained next. FIGS. 3A to 3C show a first to third code table 41–43, respectively. In FIGS. 3A to 3C, "X" indicates either bit value "0" or "1".

As is clear from a comparison of FIG. 2A and Fib. 3A, addresses of the first code table represent first data associated with the first group codes. In other words, each of first data belongs to an $n_1(=8)$ length bit pattern set consisting of each of $l_1$ length first group codes and each of $(n_1-l_1)$ length arbitrary bit patterns.

In each address corresponding to the first data, a code length and a decoded value of the corresponding variable word length code is stored. In addresses not corresponding to the first data ("THE OTHERS" in FIG. 3A), a code length longer than $n_1(=8)$ is stored therein. It should be noted that FIG. 3A is substantially the same as the code table of the third conventional method except for "THE OTHERS" addresses in FIG. 3A.

In the second code table of FIG. 3B, addresses represent second data associated with the second group codes in which first $m_1(=4)$ bits are removed. In other words, each of the second data belongs to an $(n_2-m_1)$ length bit pattern set consisting of each of $(l_2-m_1)$ length bit patterns and each of $(n_2-l_2)$ length arbitrary bit patterns, and each $(l_2-m_1)$ length bit pattern is formed by removing the first $m_1$ bits from each of the second group codes.

The reason for the removal of the first $m_1$ bits is that these bits can be identified in the first code table. In addresses indicated by "1111 1XXX" which may correspond to third group codes, a code length longer than $n_2(=12)$ is stored therein. In addition, addresses indicated by "0XXX XXXX" are not used because these addresses do not correspond to any variable word length codes.

In the third code table of FIG. 3C, addresses represent third data associated with the third group codes, the first $m_2(=8)$ bits of which are removed. In other words, each of the third data belongs to an $(N-m_2)$ length bit pattern set consisting of each of $(l_2-m_2)$ length bit patterns and each of $(N-l_3)$ length arbitrary bit patterns, and each $(l_3-m_2)$ length bit pattern is formed by removing the first $m_2$ bits from each of the third group variable word length codes.

The reason for the removal of the first $m_2$ bits is that these bits can be identified in the first and second code tables. In the third code table, addresses indicated by "THE OTHERS" are not used because these addresses do not correspond to any variable word length codes.

Figure 4:
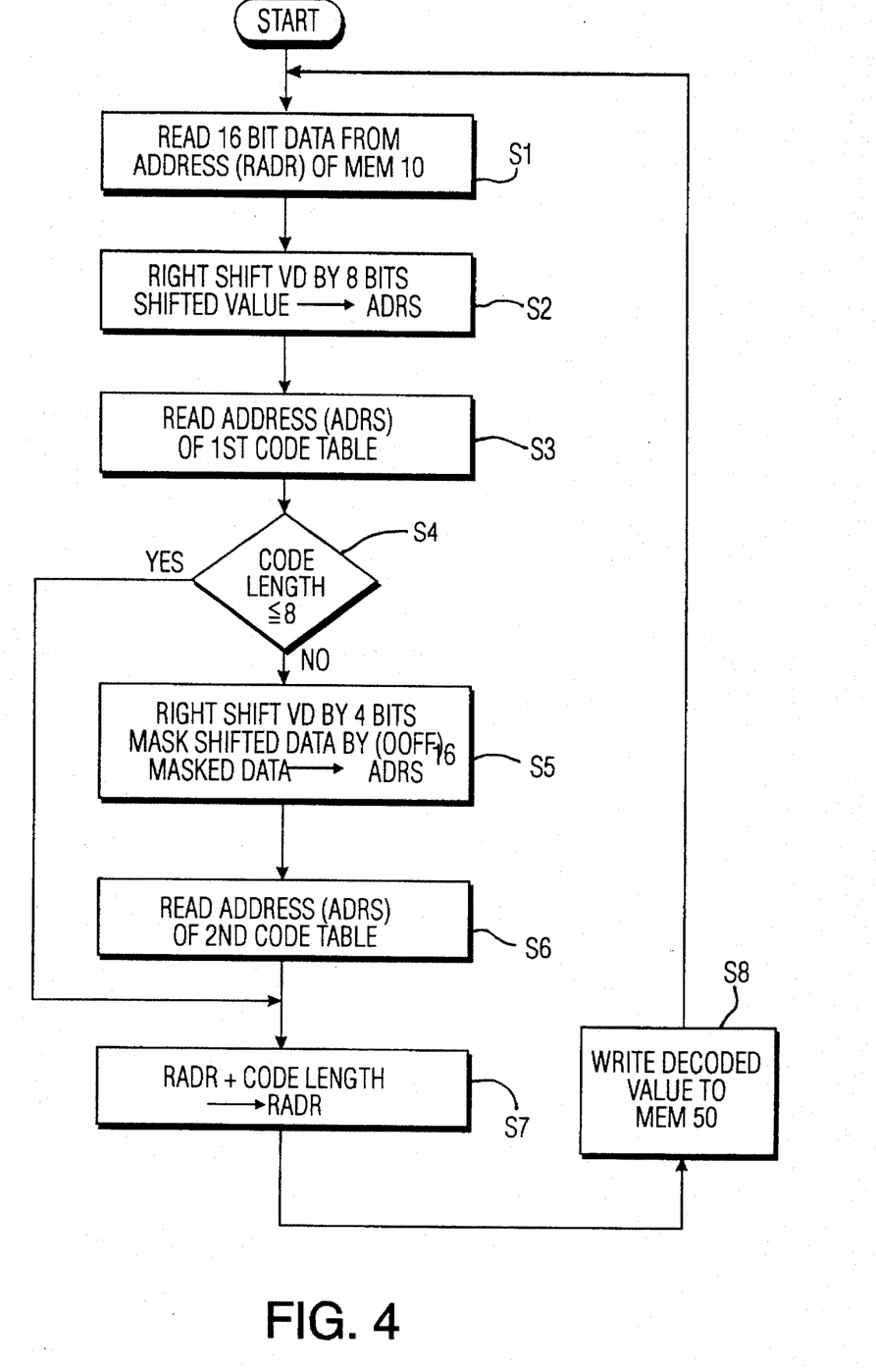
FIG. 4 shows a flow chart indicating operations of a CPU 20 of FIG. 1 in the first preferred embodiment.

Next, referring to FIG. 4, a preferred embodiment of the invention is hereinafter described. FIG. 4 is a flow chart indicating a process of the CPU 20 in the first embodiment. It should be noted that the third code table 43 is not necessary in the first embodiment because a variable word length code set of the first embodiment consists of the group 1 codes and the group 2 codes.

In step S1, first $N(=16)$ bit data of an undecoded variable word length code sequence, a top address of which is identified by the register RADR, are read out from the input memory 10 to the register VD via the bus 30.

In step S2, a value of the register VD is read out and shifted rightward by $(N-n_1)$ bits, or 8 bits. Thus, an address data of the first code table 41 corresponding to an input variable word length code is generated. The address data is stored in the register ADRS. In step S3, the CPU 20 accesses the first code table, an address of which is indicated by the register ADRS, and reads out a code length and a decoded value in the address.

In step S4, the CPU 20 compares the code length being read in the step S3 with $n_1(=8)$, or the maximum code length among the first group codes. If the code length is shorter than or equal to $n_1$, the process of the CPU 20 proceeds to step S7. This comparison result indicates that a variable word length code of the first group is identified.

If the code length being read in the step S3 is longer than 8, the process of the CPU 20 proceeds to step S5. This comparison result indicates that one of a longer variable word length code than $n_1(=8)$ bits is inputted though it is not identified yet. Therefore, the CPU 20 must access the second code table 42.

In step S5, the CPU 20 shifts rightward a value read from the register VD by $(N-n_1-m_1)$ bits, or 4 bits and masks the shifted value by a hexadecimal number $(00FF)_{16}(=0000\ 0000\ 1111\ 1111)$ to generate a masked data, which is the second data associated with the second code groups codes, the first $m_1(=4)$ bits of which are removed. The second data is stored in the register ADRS.

In step S6, the CPU 20 accesses the second code table 42, an address of which is identified by the register ADRS, and reads out a code length and a decoded value in the address. Thus, a variable word length code of the second group is identified.

In step S7, the register RDAR is incremented by the code length being read in step S3 or step S5. The new value of the register RADR indicates an address of the input memory where a first bit of an undecoded variable word length code sequence is stored.

In step S8, the CPU 20 transfers the decoded value being read in step S3 or step S5 to the output memory 50, which is read out by an external circuit (not shown) via line 2. After completing this operation, the process of the CPU 20 returns to step S1 and starts to decode a next variable word length code.

The first preferred embodiment of the invention decodes an input variable word length code sequence quickly because required access frequencies to code tables are at most 2 per a variable word length code. Moreover, the first embodiment does not require a huge capacity of the code table. As is clear from FIGS. 3A and 3B, the number of addresses required for the first and second code tables 41, 42 is $2 \times 2^8 = 512$ addresses. On the other hand, a code table of the third conventional method discussed earlier requires $2^{12}(= 4096)$ addresses when the maximum code length of a code set is 12.

Next, referring to FIGS. 5A and 5B, a second preferred embodiment of the invention will now be described. In the second embodiment, the third group codes listed in FIG. 2C are also inputted therein as the variable word length code sequence. Therefore, the third code table 43, the contents of which are shown in FIG. 3C, is also used in the second embodiment.

Figure 5A:
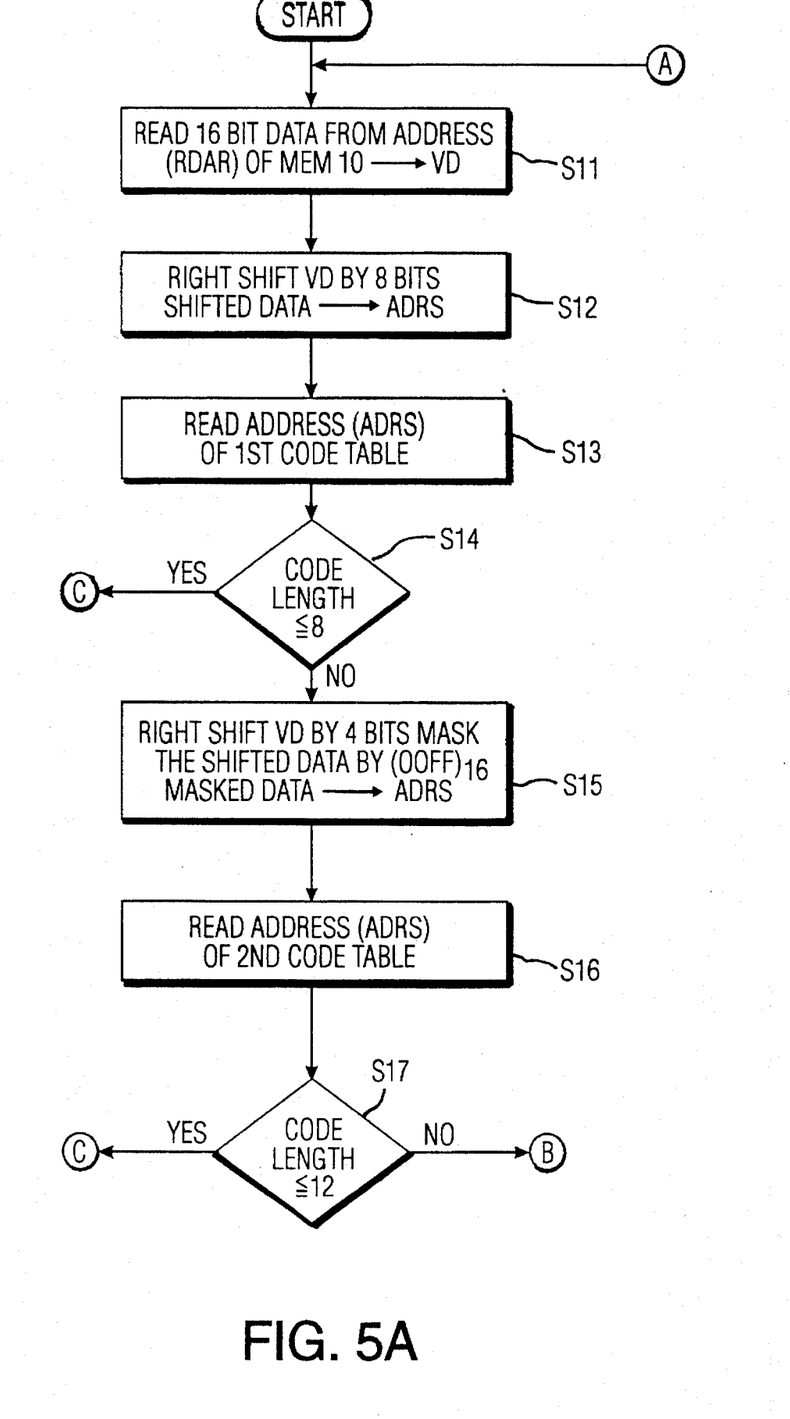
FIGS. 5A and 5B show flow charts indicating operations of a CPU 20 of FIG. 1 in the second preferred embodiment.
Figure 5B:
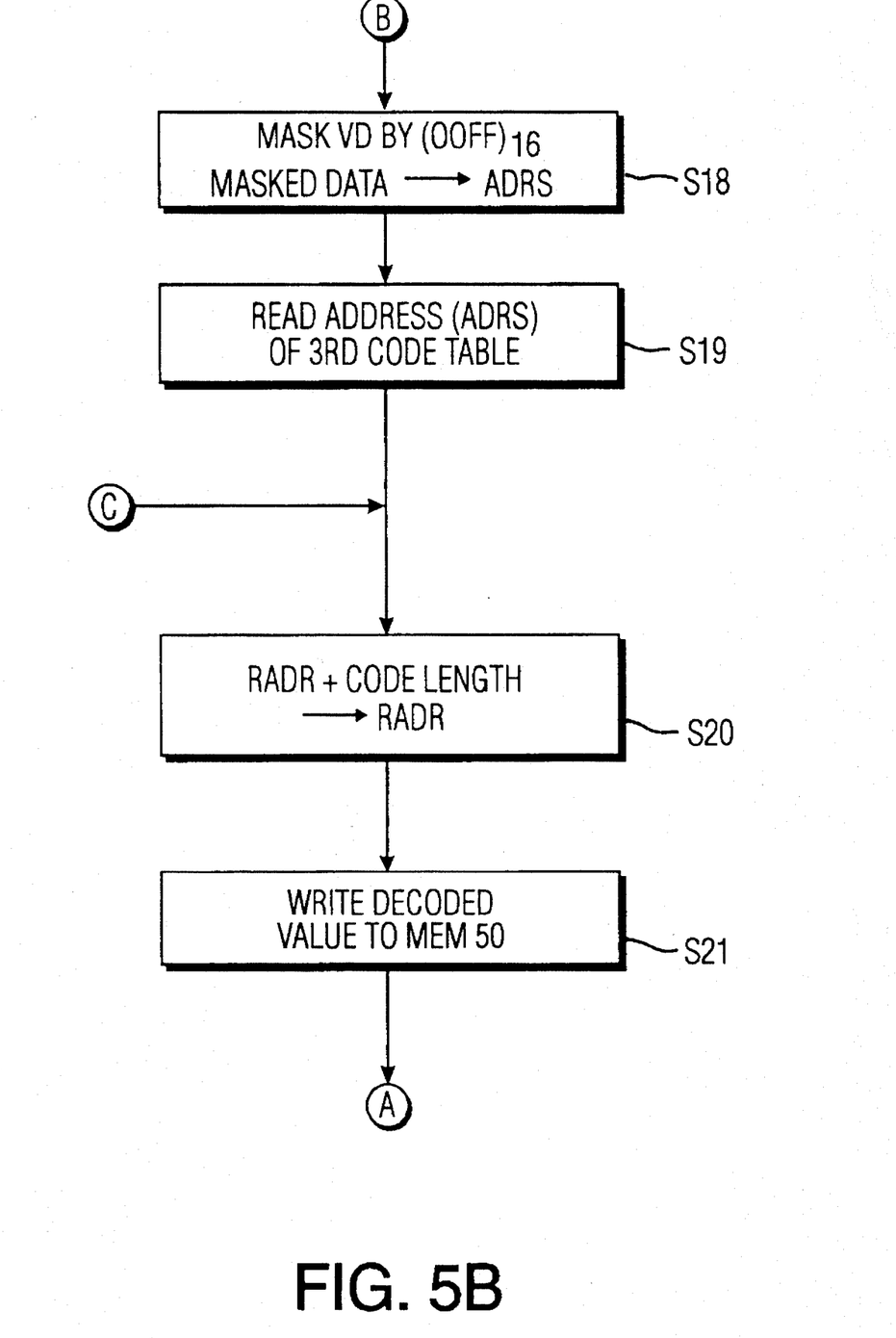

FIGS. 5A and 5B show flow charts indicating the process of the CPU 20 in the second embodiment. Since operations of step S11, S12, S13, S14, S15, S16, S20 and S21 are same as those of steps S1, S2, S3, S4, S5, S6, S7 and S8 of the first embodiment, respectively, duplicated explanation will be unnecessary.

In step S17, the CPU 20 compares the code length read in the step S16 with $n_2$, or the maximum code length among the second group codes (in this embodiment, $n_2$ is 12).

If the code length is less than or equal to $n_2$, the process of the CPU proceeds to step S20, which is the same operation as that of the step S7 of FIG. 4. This means a variable word length code of the second group is identified.

If the code length being read in the step S16 is longer than $n_2$, the process of the CPU 20 proceeds to step S18. This comparison result indicates that a variable word length code longer than $n_2$ is inputted through it and has not yet been identified. Therefore, the CPU 20 has to access the third code table 42.

In step S18, the CPU 20 masks the value of the register VD by a hexadecimal number $(00FF)_{16}$. By such masking, the CPU 20 changes first $m_2$ (in the embodiment, $m_2 = 8$) bits of the value to zero values and gets the third data associated with the third group codes, the first $m_2$ bits of which are removed. Thus, an address data of the third code table is generated. The address data is stored in the register ADRS.

In step S19, the CPU 20 accesses the third code table, an address of which is identified by the register ADRS, and reads out a code length and a decoded value in the address. Thus, a variable word length code of the third group is identified. After completing this operation, the process of the CPU 20 proceeds to the step S20.

As stated before, explanations on steps S20 and S21 are skipped in order to avoid duplicated explanations.

The second preferred embodiment of the invention also decodes an input variable word length code sequence quickly because required access frequencies to code tables are at most 3 per a variable word length code. The second preferred embodiment also does not require a huge capacity of a code table. As is clear from FIGS. 3A, 3B and 3C, the number of addresses required to the first-to-third code table 41–43 is $3 \times 2_8 = 768$ addresses. On the other hand, a code table of the third conventional method discussed earlier requires $2^{16}(=65536)$ addresses when the maximum code length of a code set is 16.

As is described in detail, the invention provides a variable word length code decoding method which decodes a variable word length code sequence quickly by using code tables with relatively small capacity.

Although the invention has been described in relation to particular embodiments, it is not thereby limited but on the contrary is susceptible to modifications and variations which will become apparent to one skilled in the art.

I claim:

1. A variable word length code method for decoding an input variable word length code sequence, comprising the steps of:

(A) storing first N bits of an undecoded variable word length code sequence of said input variable word length code sequence into a first register;

(B) generating a first value by shifting rightward a value being read out from said first register by $N-n_1$ bits, wherein $n_1$ is less than N, and storing the first value into a second register;

(C) reading a first code table based on an address indicated by said second register, wherein
   addresses of said first code table either represent first data associated with first group variable word length codes having code lengths ($I_1$) less than or equal to $n_1$ or represent first remaining data;
   said first code table stores a decoded value and a code length in each address corresponding to each of said first data; and
   said first code table also stores data representing a code length larger than $n_1$ in each address corresponding to the first remaining data;

(D) proceeding to next step (E) if a code length being read in said step (C) is longer than $n_1$ or proceeding to step (G) if not;

(E) generating a second value by changing first $m_1$ bits of the value being read from the first register to zero values, wherein $m_1$ is less than $n_1$, and by shifting rightward the changed value by $(N-n_1-m_1)$ bits; and storing the second value into said second register;

(F) reading a second code table based on an address indicated by said second register, wherein
   addresses of said second code table represent second data associated with second group variable word length codes having code lengths ($I_2$) longer than $n_1$ and $m_1$ bits of which are removed; and
   said second table stores a decoded value and a code length in each address corresponding to said second data;

(G) outputting a decoded value being read in said step (C) or said step (F) to an output memory and returning to said step (A).

2. The variable word length code decoding method, as claimed in claim 1, wherein said first $m_1$ bits are common to each other in said second group variable word length codes.

3. The variable word length code decoding method, as claimed in claim 1, wherein
   each of said first data belongs to an $n_1$ length bit pattern set consisting of each of ($I_1$) length bit patterns of said first group variable word length codes and each of ($n_1-I_1$) length arbitrary bit patterns;
   each of said second data is an ($n_2-m_1$) length bit pattern consisting of each of ($I_2-m_1$) length bit patterns and each of $(n_2-I_2)$ length arbitrary bit patterns, wherein $n_2$ is larger than $n_1$, and less than N; and each of said $(I_2-m_1)$ length bit patterns is formed by removing first $m_1$ bits from each of said second group variable word length codes.

4. A variable word length code decoding method of decoding an input variable word length code sequence, comprising the steps of:

(A) storing first N bits of an undecoded variable word length code sequence of said input variable word length code sequence into a first register;

(B) generating a first value by shifting rightward a value being read out from said first register by $N-n_1$ bits, wherein $n_1$ is less than N, and storing the first value into a second register;

(C) reading a first code table based on an address indicated by said second register, wherein
addresses of said first code table either represent first data associated with first group variable word length codes having code lengths ($I_1$) less than or equal to $n_1$ or represent first remaining data;
said first code table stores a decoded value and a code length in each address corresponding to each of said first data; and
said first code table stores data representing a code length larger than $n_1$ in each address corresponding to the first remaining data;

(D) proceeding to next step (E) if a code length being read in said step (C) is longer than $n_1$ or proceeding to step (G) if not;

(E) generating a second value by changing first $m_1$ bits of the value being read from the first register to zero values, wherein $m_1$ is less than $n_1$, and by shifting rightward the changed value by $(N-n_1-m_1)$ bits; and storing the second value into said second register;

(F) reading a second code table based on an address indicated by said second register, wherein
addresses of said second code table either represent second data associated with second group variable word length codes having code lengths $I_2$ longer than $n_1$ and $m_1$ bits of which are removed or represented second remaining data;
said second table stores a decoded value and a code length in each address corresponding to said second date; and
said second table also stores data representing a code length longer than $n_2$, wherein $n_2$ is larger than $n_1$ and less than N;

(G) proceeding to next step (H) if a code length being read in said step (F) is longer than $n_2$ or proceeding to the following step (J) if not;

(H) generating a third value by changing first $m_2$ bits or said value from said first register to zero values and storing said third value into said second register;

(I) reading a third code table based on an address indicated by said second register, wherein
addresses of said third code table represent third data associated with third group variable word length codes having code lengths $I_3$ longer than $n_2$ and first $m_2$ bits of which are removed, wherein $m_2$ is less than $n_2$ and larger than $m_1$;
said third code table stores a decoded value and a code length in each address corresponding to said third data; and (J) outputting a decoded value being read in said step (C), said step (F) or said step (I) to an output memory and returning to said step (A).

5. The variable word length code decoding method as claimed in claim 4, wherein
said first $m_1$ bits are common to each other in said second group variable word length codes; and
said first $m_2$ bits are common to each other in said third group variable word length codes.

6. The variable word length code decoding method, as claimed in claim 5, wherein
each of said first data belongs to an $n_1$ length bit pattern set consisting of each of $I_1$ length bit patterns of said first group variable word length codes and each of $(n_1-I_1)$ length arbitrary bit patterns;
each of said second data is an $(n_2-m_1)$ length bit pattern consisting of each of $(I_2-m_1)$ length bit patterns and each of $(n_2-I_2)$ length arbitrary bit patterns;
each of said $(I_2-m_1)$ length bit patterns is formed by removing first $m_1$ bits from each of the second group variable length codes;
each of said third data belong to an $(N-m_2)$ length bit pattern set consisting of each of $(I_3-m_2)$ length bit patterns and each of $(N-I_3)$ length arbitrary bit patterns; and
each of said $(I_3-m_2)$ length bit pattern is formed by removing first $m_2$ bit from each of the third group variable word length codes.

7. A variable word length code decoder for decoding an input variable word length code sequence, comprising:

(A) means for storing first N bits of an undecoded variable word length code sequence of said input variable word length code sequence into a first register;

(B) means for generating a first value by shifting rightward a value being read out from said first register by $N-n_1$ bits, wherein $n_1$ is less than N, and storing the first value into a second register;

(C) means for reading a first code table based on an address indicated by said second register, wherein
addresses of said first code table either represent first data associated with first group variable word length codes having code lengths ($I_1$) less than or equal to $n_1$ or represent first remaining data;
said first code table stores a decoded value and a code length in each address corresponding to each of said first data; and
said first code table also stores data representing a code length larger than $n_1$ in each address corresponding to the first remaining data;

(D) means for generating a second value by changing first $m_1$ bits of the value being read from the first register to zero values, wherein $m_1$ is less than $n_1$, and by shifting rightward the changed value by $(N-n_1-m_1)$ bits; and storing the second value into said second register;

(E) means for reading a second code table based on an address indicated by said second register, wherein
addresses of said second code table represent second data associated with second group variable word length codes having code lengths ($I_2$) longer than $n_1$ and $m_1$ bits of which are removed; and
said second table stores a decoded value and a code length in each address corresponding to said second data;

(F) outputting a decoded value being read by said means (C) or said means (E) to an output memory.

8. The variable word length code decoder, as claimed in claim 7, wherein said first $m_1$ bits are common to each other in said second group variable word length codes.

9. The variable word length code decoder, as claimed in claim 7, wherein each of said first data belongs to an $n_1$ length bit pattern set consisting of each of ($I_1$) length bit patterns of said first group variable word length codes and each of ($n_1-I_1$) length arbitrary bit patterns;

each of said second data is an ($n_2-m_1$) length bit pattern consisting of each of ($I_2-m_1$) length bit patterns and each of ($n_2-I_2$) length arbitrary bit patterns, wherein $n_2$ is larger than $n_1$ and less than N; and each of said ($I_2-m_1$) length bit patterns is formed by removing first $m_1$ bits from each of said second group variable word length codes.

10. A variable word length code decoder decoding an input variable word length code sequence, comprising:

(A) means for storing first N bits of an undecoded variable word length code sequence of said input variable word length code sequence into a first register;

(B) means for generating a first value by shifting rightward a value being read out from said first register by $N-n_1$ bits, wherein $n_1$ is less than N, and storing the first value into a second register;

(C) means for reading a first code table based on an address indicated by said second register, wherein addresses of said first code table either represent first data associated with first group variable word length codes having code lengths ($I_1$) less than or equal to $n_1$ or represent first remaining data;

said first code table stores a decoded value and a code length in each address corresponding to each of said first data; and said first code table stores data representing a code length larger than $n_1$ in each address corresponding to the first remaining data;

(D) means for generating a second value by changing first $m_1$ bits of the value being read from the first register to zero values, wherein $m_1$ is less than $n_1$, and by shifting rightward the changed value by ($N-n_1-m_1$) bits; and storing the second value into said second register;

(E) means for reading a second code table based on an address indicated by said second register, wherein addresses of said second code table either represent second data associated with second group variable word length codes having code lengths $I_2$ longer than $n_1$ and $m_1$ bits of which are removed or represented second remaining data;

said second table stores a decoded value and a code length in each address corresponding to said second date; and said second table also stores data representing a code length longer than $n_2$, wherein $n_2$ is larger than $n_1$ and less than N;

(F) means for generating a third value by changing first $m_2$ bits or said value from said first register to zero values and storing said third value into said second register;

(G) means for reading a third code table based on an address indicated by said second register, wherein addresses of said third code table represent third data associated with third group variable word length codes having code lengths $I_3$ longer than $n_2$ and first $m_2$ bits of which are removed, wherein $m_2$ is less than $n_2$ and larger than $m_1$;

said third code table stores a decoded value and a code length in each address corresponding to said third data; and (H) means for outputting a decoded value being read by said means (C), said means (E) or said means (G) to an output memory.

11. The variable word length code decoder as claimed in claim 10, wherein said first $m_1$ bits are common to each other in said second group variable word length codes; and said first $m_2$ bits are common to each other in said third group variable word length codes.

12. The variable word length code decoder, as claimed in claim 11, wherein each of said first data belongs to an $n_1$ length bit pattern set consisting of each of $I_1$ length bit patterns of said first group variable word length codes and each of ($n_1-I_1$) length arbitrary bit patterns;

each of said second data is an ($n_2-m_1$) length bit pattern consisting of each of ($I_2-m_1$) length bit patterns and each of ($n_2-I_2$) length arbitrary bit patterns;

each of said ($I_2-m_1$) length bit patterns is formed by removing first $m_1$ bits from each of the second group variable length codes;

each of said third data belong to an ($N-m_2$) length bit pattern set consisting of each of ($I_3-m_2$) length bit patterns and each of ($N-I_3$) length arbitrary bit patterns: and each of said ($I_3-m_2$) length bit pattern is formed by removing first $m_2$ bit from each of the third group variable word length codes.

* * * * *